United States Patent
Chen et al.

(10) Patent No.: US 7,719,258 B2
(45) Date of Patent: May 18, 2010

(54) METHOD AND APPARATUS FOR CURRENT MEASUREMENT USING HALL SENSORS WITHOUT IRON CORES

(75) Inventors: Kun-Long Chen, Taipei County (TW); Nan-Ming Chen, Taipei (TW)

(73) Assignee: National Taiwan University of Science and Technology, Taipei (TW)

(*) Notice: Subject to any disclaimer, the term of this patent is extended or adjusted under 35 U.S.C. 154(b) by 0 days.

(21) Appl. No.: 12/249,969

(22) Filed: Oct. 13, 2008

(65) Prior Publication Data

US 2010/0090684 A1   Apr. 15, 2010

(51) Int. Cl.
*G01R 33/07* (2006.01)
*G01R 33/00* (2006.01)

(52) U.S. Cl. .............................. 324/117 H; 324/123 R; 324/126; 324/242

(58) Field of Classification Search ............. 324/117 H, 324/123 R, 126, 242
See application file for complete search history.

(56) References Cited

U.S. PATENT DOCUMENTS

| | | | |
|---|---|---|---|
| 3,995,210 A | 11/1976 | Milkovic | |
| 4,425,596 A | 1/1984 | Satou | |
| 4,525,669 A | 6/1985 | Holberton et al. | |
| 5,075,628 A | 12/1991 | Schuster et al. | |
| 5,438,257 A * | 8/1995 | Berkcan | 324/117 R |
| 5,479,095 A | 12/1995 | Michalek et al. | |
| 6,204,657 B1 | 3/2001 | Stanley | |
| 6,636,029 B1 * | 10/2003 | Kunze et al. | 324/117 R |
| 7,227,347 B2 * | 6/2007 | Viaro et al. | 324/117 H |
| 7,355,381 B2 * | 4/2008 | Noel | 324/117 R |
| 2006/0132141 A1 * | 6/2006 | Dougherty et al. | 324/435 |
| 2006/0284613 A1 * | 12/2006 | Hastings et al. | 324/117 H |

FOREIGN PATENT DOCUMENTS

| | | |
|---|---|---|
| JP | 63-140313 | 6/1988 |
| JP | 2000-235051 | 8/2000 |
| JP | 2002-103053 | 4/2002 |
| JP | 2003-014789 | 1/2003 |
| JP | 2003-217952 | 7/2003 |
| TW | 263413 | 11/1995 |
| TW | 332256 | 5/1998 |
| TW | M300002 | 10/2006 |

* cited by examiner

*Primary Examiner*—Ha Tran T Nguyen
*Assistant Examiner*—Emily Y Chan
(74) *Attorney, Agent, or Firm*—Jianq Chyun IP Office

(57) ABSTRACT

A method and apparatus for current measurement using Hall sensors without iron cores, used to estimate a flowing current in an electric conducting cable are provided by the exemplary examples of the present invention. The method for current measurement using Hall sensors without iron cores includes the following step: (a) providing Hall sensors to be attached to or located near the electric conducting cable; (b) using each of the Hall sensors to measure the flux density of the magnetic field generated by the flowing current, so as to generate an output voltage according to the flux density of the magnetic field; (c) performing a statistical operation on the output voltages of the Hall sensors, so as to generate a statistical voltage; (d) estimating the flowing current in the electric conducting cable according to the statistical voltage.

11 Claims, 16 Drawing Sheets

METHOD AND APPARATUS FOR CURRENT MEASUREMENT USING HALL SENSORS WITHOUT IRON CORES

BACKGROUND OF THE INVENTION

1. Field of Invention

The present invention generally relates to a method and apparatus for current measurement, and more particularly to a method and apparatus for current measurement using Hall sensors without iron cores.

2. Description of Prior Art

In power systems, safety and reliability are the most important considerations. In order to meet safety and reliability requirements of the power systems, appropriate current transformers are used to measure currents for metering and fault protection.

A traditional current transformer is an apparatus for current measurement. The traditional transformer using the coil magnetic effect has an iron core. Therefore it has the problems of direct current and alternating current saturations, and remanent magnetization. All of the problems mentioned above are caused by the effect of hysteresis. The problem of direct current saturation caused by the effect of hysteresis may affect the current measurement of the current transformer most severely.

When faults occur in power systems, fault currents usually contain large direct offsets, and thus, may cause iron cores of current transformers to be saturated. This may cause distortion of current waveforms in secondary windings, resulting in false responses in current detection and protective systems. These problems seriously affect the safety and reliability of power systems.

Since traditional current transformers have these problems, including direct current and alternating current saturations, and remanent magnetization, caused by iron cores, several technologies for decreasing the effects caused by iron cores have been proposed. The technologies include air-gap current transformers, linear coupler current transformers, electro-optics current transformers, and linear current transformers (i.e Rogowski coil transformers.).

However, in practical applications, only the linear current transformer is used, and the others are not used due to their disadvantages and low practicalities. When a large transient current flows in a power system, the linear current transformer can perform better than the traditional current transformer. Nevertheless, the cost of the linear current transformer is high, and thus, causes limited usage of the linear transformer. Moreover, the bulky volume of the traditional current transformer further limits the development of an intelligent power protection system. Therefore, the research of the current transformer is still one of the important issues in power industry.

According to properties of the electromagnetic field in a power cable when an alternating current flows in this cable, based on Ampere's circuital law, a magnetic field is produced outside the insulator, and it changes with the waveform of current. For sensing the variation of the magnetic field and decreasing the bulky volume, Hall sensors have been researched for replacing traditional current transformers. Based on Lorentz force, Hall sensors have quick response times, and can measure a wide range of magnetic fields. Moreover, the related compensations can be integrated into Hall sensors to help them show steady performances and have high sensitivity. Therefore, Hall sensors can be used to replace traditional current transformers.

At present, Hall-effect transducers include two parts: iron cores and auxiliary circuits, either open-loop circuits or closed-loop circuits. These transducers are mainly used to measure small currents with large bandwidths. They still contain iron cores, because iron cores not only can transform the magnetic field into electricity but also can block the interference of the ambient magnetic fields. Furthermore, with iron cores, measurements of Hall current transformers will not be affected by the geometric shape of the measured object, and the magnetic field thereof can be concentrated.

However the Hall current transformers with iron cores still have the problems of direct current and alternating current saturations, and the volumes of them are also almost the same as those of traditional current transformers.

SUMMARY OF THE INVENTION

The exemplary examples of the present invention provide a method and apparatus for current measurement using Hall sensors without iron cores. The method and apparatus for current measurement using Hall sensors without iron cores can be used to measure the currents of the electric conducting cables whether the power system adopts one electric conducting cable or a plurality of electric conducting cables to supply the power.

The exemplary example of the present invention provides an apparatus for current measurement using Hall sensors without iron cores. The apparatus for current measurement using Hall sensors without iron cores is used to estimate a flowing current in an electric conducting cable. The apparatus for current measurement using Hall sensors without iron cores comprises the Hall sensors and a statistical operation circuit. Each of the Hall sensors is used for attaching to or locating near the electric conducting cable and to measure the flux density of a magnetic field generated by the flowing current, so as to generate an output voltage according to the flux density of a magnetic field. The statistical operation circuit is coupled to the Hall sensors. The statistical operation circuit receives the output voltages of the Hall sensors and performs a statistical operation on the output voltages of the Hall sensors, so as to obtain a statistical voltage. Wherein the apparatus for current measurement using Hall sensors without iron cores estimates the flowing current according to the statistical voltage.

The exemplary example of the present invention provides an apparatus for current measurement using Hall sensors without iron cores, which is applied in a three-phase power system. The apparatus for current measurement using Hall sensors without iron cores is used to estimate a flowing current in an electric conducting cable of the three-phase power system. The apparatus for current measurement using Hall sensors without iron cores comprises the Hall sensors and a statistical operation circuit. Each of the Hall sensors is used for attaching to or locating near the electric conducting cable and to measure the flux density of a magnetic field generated by the flowing current, so as to generate an output voltage according to the flux density of the magnetic field. The statistical operation circuit is coupled to the Hall sensors. The statistical operation circuit receives the output voltages of the Hall sensors and performs a statistical operation on the output voltages of the Hall sensors, so as to obtain a statistical voltage. Wherein the apparatus for current measurement using Hall sensors without iron cores estimates the flowing current according to the statistical voltage.

The exemplary example of the present invention provides a method for current measurement using Hall sensors without iron cores. The method for current measurement using Hall sensors without iron cores comprises the following step: (a) providing Hall sensors to be attached to or located near the electric conducting cable; (b) using each of the Hall sensors to measure the flux density of the magnetic field generated by the flowing current, so as to generate an output voltage according to the flux density of the magnetic field; (c) performing a statistical operation on the output voltages of the Hall sensors, so as to generate a statistical voltage; (d) estimating the flowing current in the electric conducting cable according to the statistical voltage.

Accordingly, the method and apparatus for current measurement using Hall sensors without iron cores provided by the exemplary examples of the present invention can eliminate the ambient interference and the effect caused by the measured electric conducting cable being not an infinitely long straight conductor.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
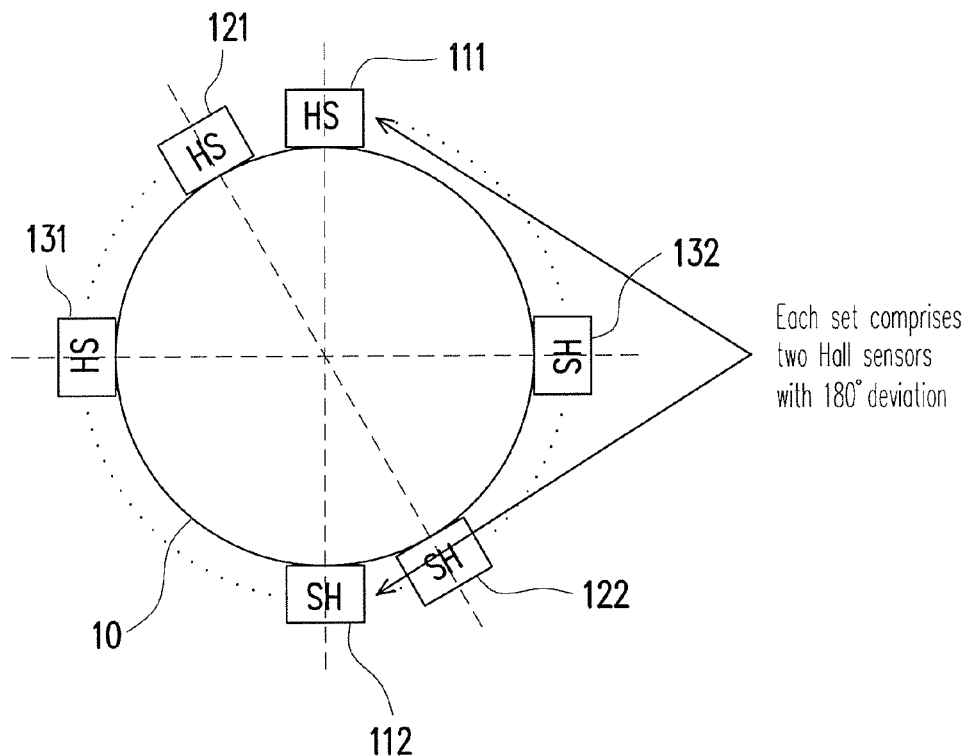
FIG. 1 is a schematic diagram showing the arrangement of the Hall sensors of the method and apparatus for current measurement using Hall sensors without iron cores according to one of the exemplary examples of the present invention.

Reference will now be made in detail to the present preferred embodiment of the invention, examples of which are illustrated in the accompanying drawings. Wherever possible, the same reference numbers are used in the drawings and the description to refer to the same or like parts.

When a current flows in an electric conducting cable, a magnetic field outside the electric conducting cable is generated by the current. In the calculation of the magnetic field and the current, since the power frequency is extremely low, the magnetic field can be considered to be static. Therefore, the magnetic field can be determined by Biot-Savart law. Further, in the measurement of the design, since the Hall sensors are attached to or located near the measured electric conducting cable, it can be assumed the electric conducting cable is seen as a long straight wire. Therefore, the measured flux density of the magnetic field can be expressed as $B=\mu_0 I/2\pi R$, wherein R is the distance from the electric conducting cable to the point where the magnetic flux density is to be measured, and I is the current to be measured, and $\mu_0$ is the permeability in free space. When the measured flux density of the magnetic field is obtained, the current Ito be measured can be obtained by the mentioned equation.

In the real world, the electric conducting cable is not a long straight wire, and the circular tangent plane of the electric conducting cable is not a perfect circular plane which is not symmetric. Thus, these non-ideal properties will accumulate the measuring errors of the current transformers with the Hall sensors.

The exemplary examples of the present invention provide a method and apparatus for current measurement using Hall sensors without iron cores. The method and apparatus for current measurement using Hall sensors without iron cores can be used to measure the current of the electric conducting cable whether the power system has one electric conducting cable or a plurality of electric conducting cables to supply the power. In other words, the method and apparatus for current measurement using Hall sensors without iron cores provided by the exemplary examples of the present invention can eliminate the ambient interference and the effect caused by the measured electric conducting cable being not an infinitely long straight conductor.

Referring to FIG. 1, FIG. 1 is a schematic diagram showing the arrangement of the Hall sensors of the method and apparatus for current measurement without iron cores according to one of the exemplary examples of the present invention. A plurality of sets of Hall sensors are attached to or located near the measured electric conducting cable 10. In the exemplary example, the Hall sensors 111 and 112 with 180° deviation foam one of the sets of the Hall sensors, the Hall sensors 121 and 122 with 180° deviation form one of the sets of the Hall sensors, and the Hall sensors 131 and 132 with 180° deviation form one of the sets of the Hall sensors. Although there are three sets of the Hall sensors in FIG. 1, however the number of sets of the Hall sensors is not fixed. That is, even only one set of two Hall sensors are attached to or located near the electric conducting cable 10, the method and apparatus for current measurement using the set of two Hall sensors can still perform well in the exemplary example.

Furthermore, the electric conducting cable 10 can be any kind of cable, such as American Wire Gauge (AWG) cable, Cross-Linked Polyethylene (XLPE) cable, Polyethylene (PE) cable, Polyvinyl (PVC) cable, Polyether Sulfone (PES) cable, Polyetheretherketone (PEEK) cable, and so on.

The Hall sensors 111, 112, 121, 122, 131, 132 sense the magnetic field to obtain each flux density of the magnetic field, and calculate the measured currents according to the flux densities of the magnetic field. Then the Hall sensors 111, 112, 121, 122, 131, 132 generate output voltages to their rear circuit. The rear circuit performs a statistical operation on the received voltages to generate a statistical voltage, and the statistical voltage can be used to estimate the flowing current in the electric conducting cable 10.

It is to be noted that taking the output voltage of the Hall sensors into the statistical operation to obtain the statistical voltage and using the statistical voltage to estimate the flowing current in the electric conducting cable can eliminate the effects of the non-uniform magnetic field distribution caused by the asymmetry of the electric conducting cable 10. Thus, the number of the Hall sensors in the set is not used to limit the scope of the present invention. For example, one set of three Hall sensors may perform well as mentioned above. Further, it is straight forward that a symmetrical arrangement of the Hall sensors in the set may obtain a good measuring result. For example, three Hall sensors in the set may be deviated with 120°.

Figure 2:
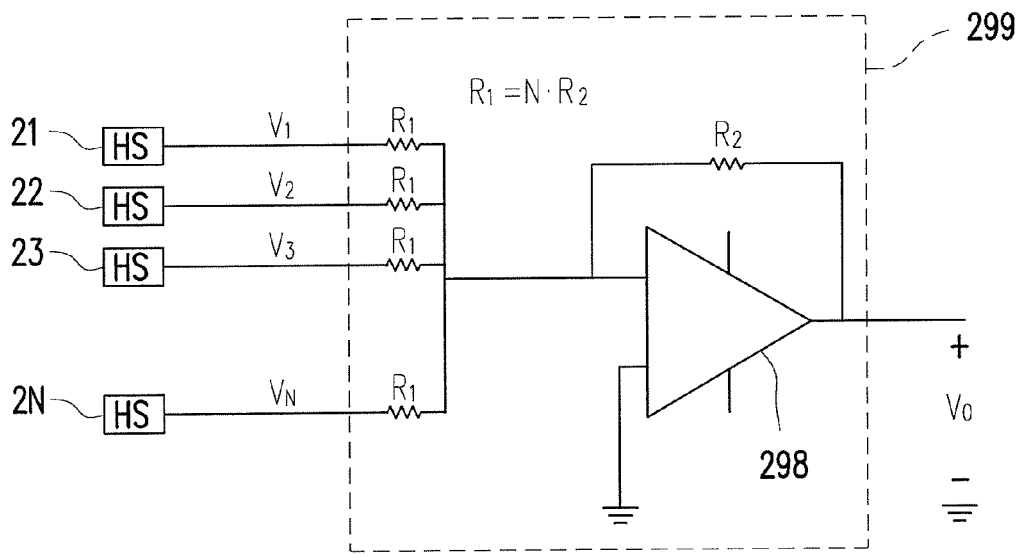
FIG. 2 is a circuit diagram showing the apparatus for current measurement using the Hall sensors without iron cores provided by one of the exemplary examples of the present invention.

Please see FIG. 2, FIG. 2 is a circuit diagram showing the apparatus for current measurement using the Hall sensors without iron cores provided by one of the exemplary examples of the present invention. The Hall sensors 21-2N are used to sense the flux densities of the magnetic field to generate the output voltages to the statistical operation circuit 299. The statistical operation circuit 299 in the exemplary example is an averaging circuit. The statistical operation circuit 299 is composed of a plurality of the resistors R1, R2 and an operation amplifier 298. In the exemplary example, the statistical voltage $V_o$ is the average of the output voltages of the Hall sensors 21~2N, and the statistical voltage $V_o$ is expressed as $$V_O = -\left(\frac{R_2}{R_1}V_1 + \frac{R_2}{R_1}V_2 + \frac{R_2}{R_1}V_3 + \ldots + \frac{R_2}{R_1}V_N\right) = -\left(\frac{V_1}{N} + \frac{V_2}{N} + \frac{V_3}{N} + \ldots + \frac{V_N}{N}\right),$$

wherein $R_2 = NR_1$, and N is the number of the Hall sensors. After obtaining the statistical voltage, the method and apparatus for current measurement provided by one of the exemplary examples of the present invention can estimate the flowing current in the electric conducting cable according to the statistical voltage.

Figure 3:
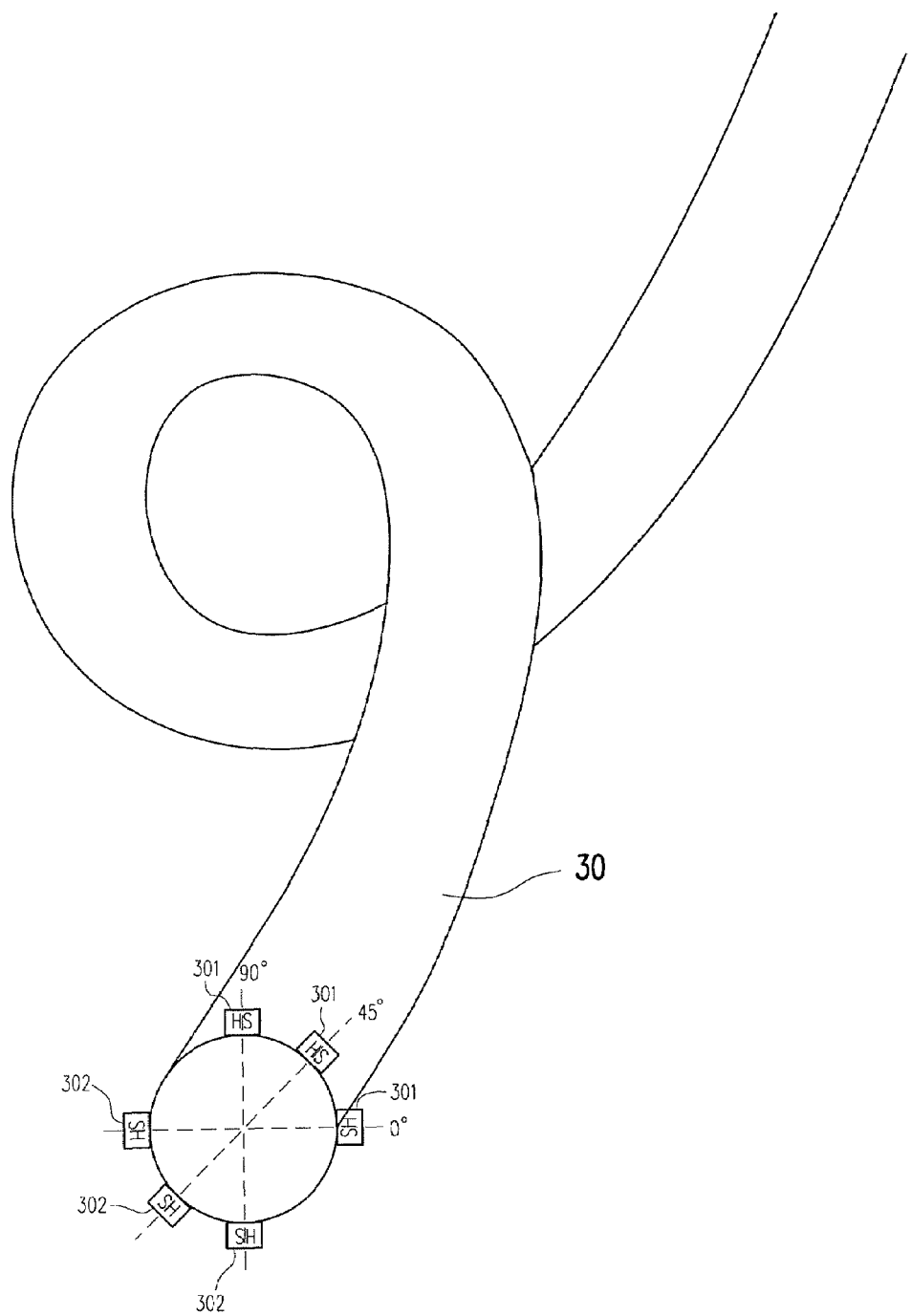
FIG. 3 is a schematic diagram showing the different arrangements of the two Hall sensors of the method and apparatus for current measurement without iron cores provided by one of the exemplary examples of the present invention.
Figure 4:
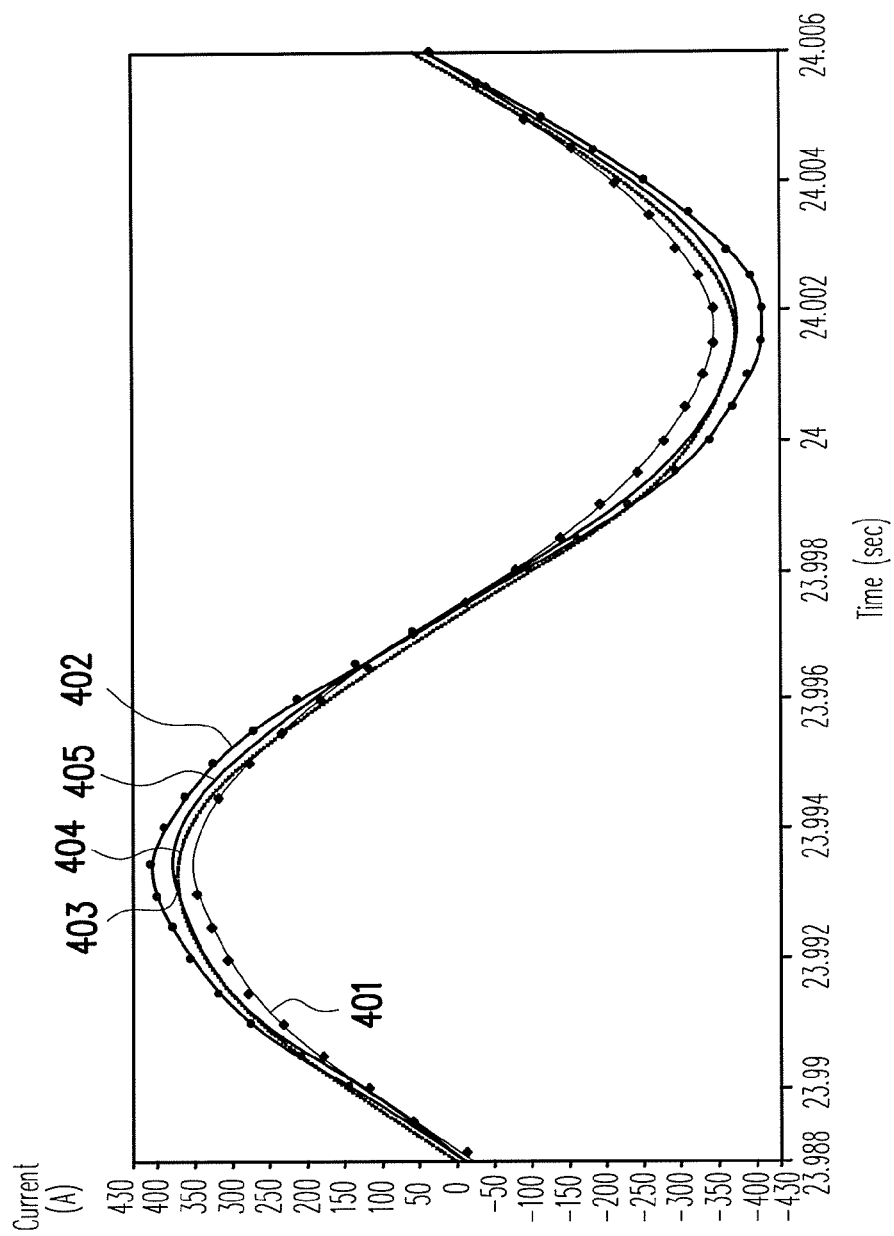
FIG. 4 is the curve diagram showing the estimated flowing current in the electric conducting cable 30 when the two Hall sensors 301 and 302 put on the 0° and 180° positions of FIG. 3 respectively.
Figure 5:
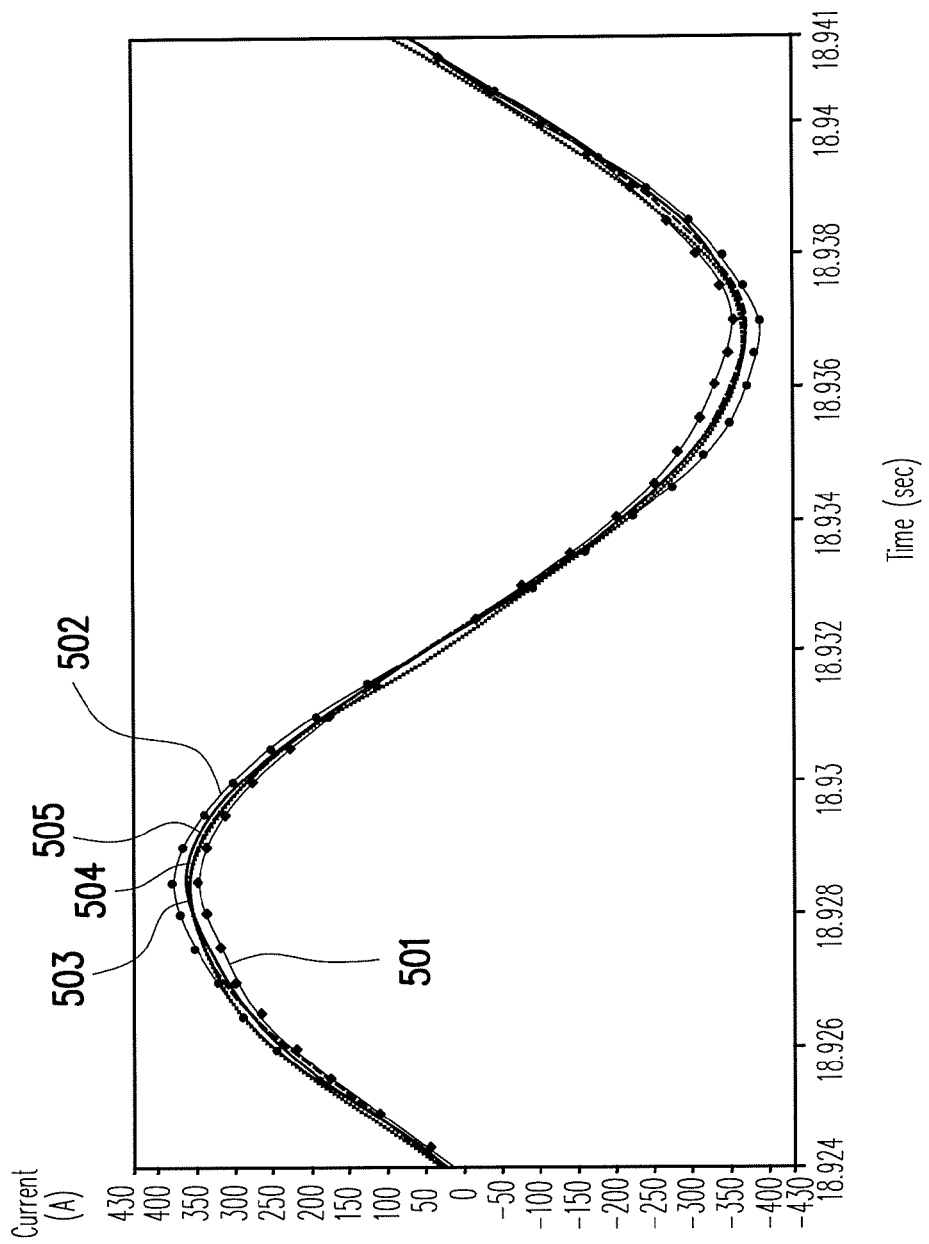
FIG. 5 is the curve diagram showing the estimated flowing current in the electric conducting cable 30 when the two Hall sensors 301 and 302 put on the 45° and 225° positions of FIG. 3 respectively.
Figure 6:
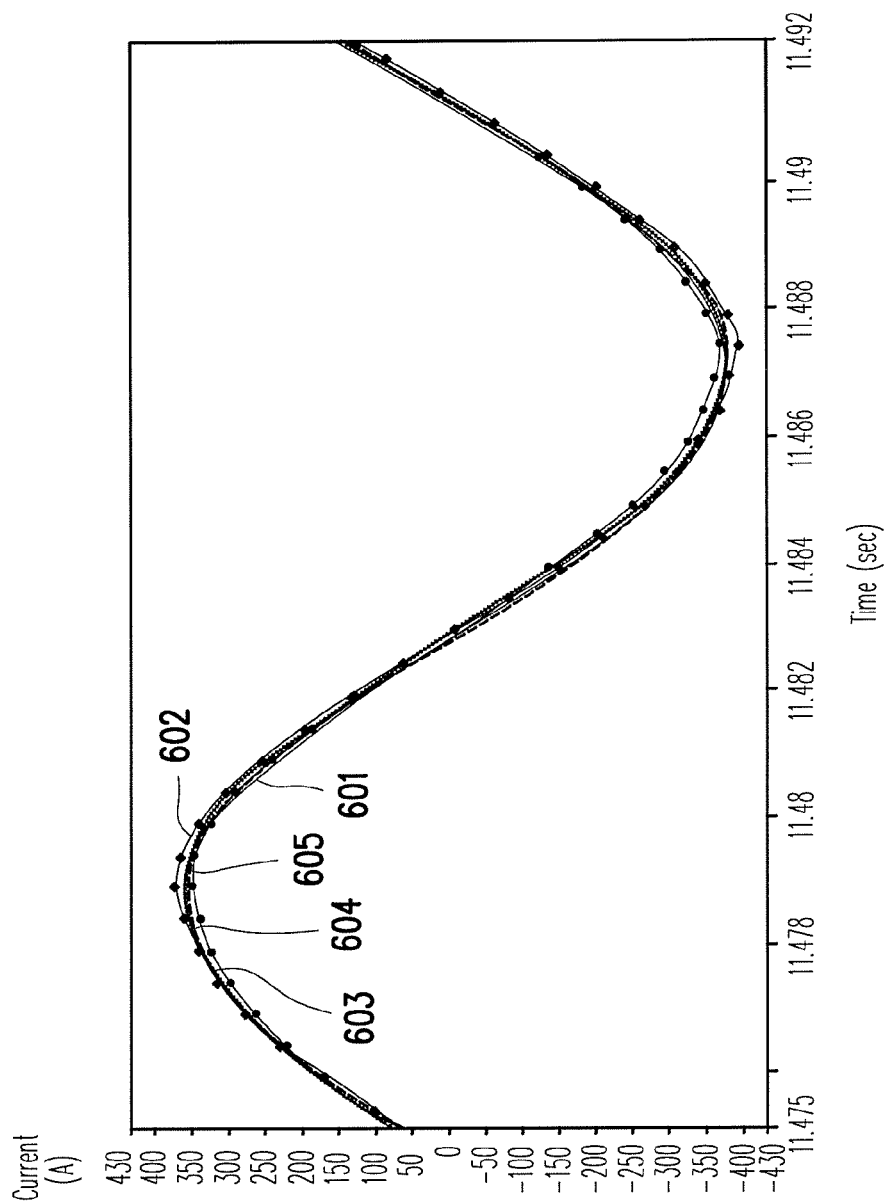
FIG. 6 is the curve diagram showing the estimated flowing current in the electric conducting cable when the two Hall sensors 301 and 302 put on the 90° and 270° positions of FIG. 3 respectively.

Pleases see FIGS. 3-6, FIG. 3 is a schematic diagram showing the different arrangements of the two Hall sensors of the method and apparatus for current measurement without iron cores provided by one of the exemplary examples of the present invention, and FIGS. 4-6 are curve diagrams showing the estimated flowing current in the electric conducting cable 30 according to the different arrangements of the Hall sensors of the method and apparatus for current measurement using Hall sensors without iron cores in FIG. 3. In FIG. 3, the electric conducting cable 30 is not a long straight wire. The electric conducting cable 30 is bent to the left, and therefore the flux densities of the magnetic field in the left are larger than those in the right. In this exemplary example, the method and apparatus for current measurement use only one set of the two Hall sensors 301 and 302 with 180° deviation.

FIG. 4 is the curve diagram showing the estimated flowing current in the electric conducting cable 30 when the two Hall sensors 301 and 302 put on the 0° and 180° positions of FIG. 3 respectively. In FIG. 4, the horizontal axis represents the magnitude of time, and the vertical axis represents the magnitude of the current.

The curve 401 represents the measured current of the Hall sensor 301, and the curve 402 represents the measured current of the Hall sensor 302. The curve 403 represents the estimated flowing current in the electric conducting cable 30 measured by the method and apparatus for current measurement provided by one of the exemplary examples of the present invention. The magnitude of the estimated flowing current is the average of the magnitudes of the currents of the curve 401 and 402. The curves 404 and 405 represent the estimated flowing current measured by the traditional current transformer and the liner current transformer.

FIG. 5 is the curve diagram showing the estimated flowing current in the electric conducting cable 30 when the two Hall sensors 301 and 302 put on the 45° and 225° positions of FIG. 3 respectively. In FIG. 5, the horizontal axis represents the magnitude of time, and the vertical axis represents the magnitude of the current.

The curve 501 represents the measured current of the Hall sensor 301, and the curve 502 represents the measured current of the Hall sensor 302. The curve 503 represents the estimated flowing current in electric conducting cable 30 measured by the method and apparatus for current measurement provided by one of the exemplary examples of the present invention. The magnitude of the estimated flowing current is the average of the magnitudes of the currents of the curve 501 and 502. The curves 504 and 505 represent the estimated flowing current measured by the traditional current transformer and the liner current transformer.

FIG. 6 is the curve diagram showing the estimated flowing current in the electric conducting cable 30 when the two Hall sensors 301 and 302 put on the 90° and 270° positions of FIG. 3. In FIG. 6, the horizontal axis represents the magnitude of time, and the vertical axis represents the magnitude of the current.

The curve 601 represents the measured current of the Hall sensor 301, and the curve 602 represents the measured current of the Hall sensor 302. The curve 603 represents the estimated flowing current in the electric conducting cable 30 measured by the method and apparatus for current measurement provided by one of the exemplary examples of the present invention. The magnitude of the estimated flowing current is the average of the magnitudes of the currents of the curve 601 and 602. The curves 604 and 605 represent the estimated flowing current measured by the traditional current transformer and the liner current transformer.

In FIGS. 4-6, the estimated flowing currents measured by the traditional current transformer, the liner current transformer, and the method and apparatus for current measurement provided by one of the exemplary examples of the present invention approach to each other. That is, the precision of the method and apparatus for current measurement provided by one of the exemplary examples of the present invention is precise as well as those of the traditional current transformer and the liner current transformer.

Accordingly, the method and apparatus for current measurement using Hall sensors without iron cores can be used to measure the current of the electric conducting cable when the power system has one electric conducting cable to supply the power. However, in some conditions, the power system has a plurality of electric conducting cables to supply the power, such as the three-phase power system.

Figure 7A:
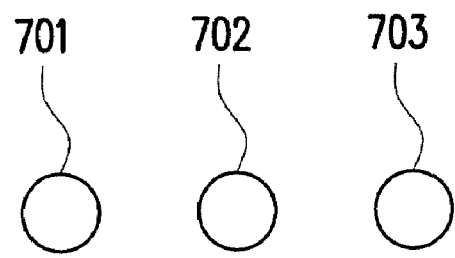
FIGS. 7A and 7B are schematic diagrams showing arrangements of the R, S and T electric conducting cables.
Figure 7B:
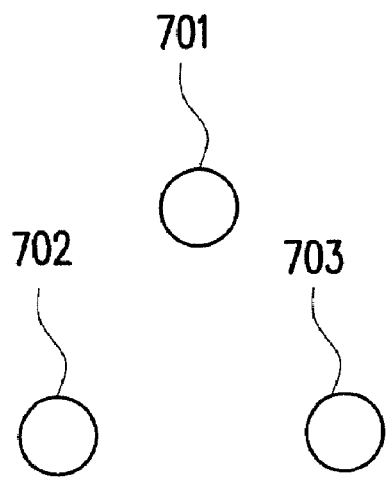

Taking the three-phase power system for example, the three-phase power system has R, S and T electric conducting cables. Referring to FIGS. 7A and 7B, FIGS. 7A and 7B are schematic diagrams showing arrangements of the R, S and T electric conducting cables. The R, S and T electric conducting cables 701~703 may be arranged in parallel vertically in the same place (shown in FIG. 7A) or in a regular triangle (shown in FIG. 7B). The R, S and T electric conducting cables have different phases at the same time. The flowing currents in the R, S, and T electric conducting cables can be expressed as $i_R(t)=I_m \cos(\omega t)$, $i_S(t)=I_m \cos(\omega t+120°)$, and $i_T(t)=I_m \cos(\omega t-120°)$, wherein $I_m$ is the amplitude of the flowing currents, and $\omega$ is the angular frequency of the flowing currents.

Figure 8A:
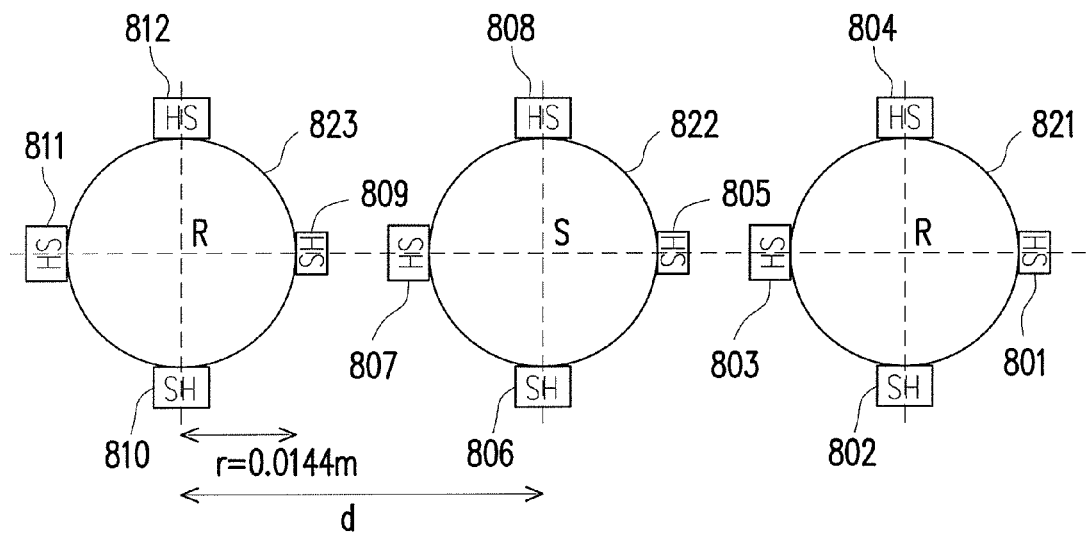
FIG. 8A is a schematic diagram showing the method and apparatus for current measurement using the Hall sensors without iron cores in the three-phase power system while the R, S and T electric conducting cables are arranged in parallel vertically in the same place.
Figure 8B:
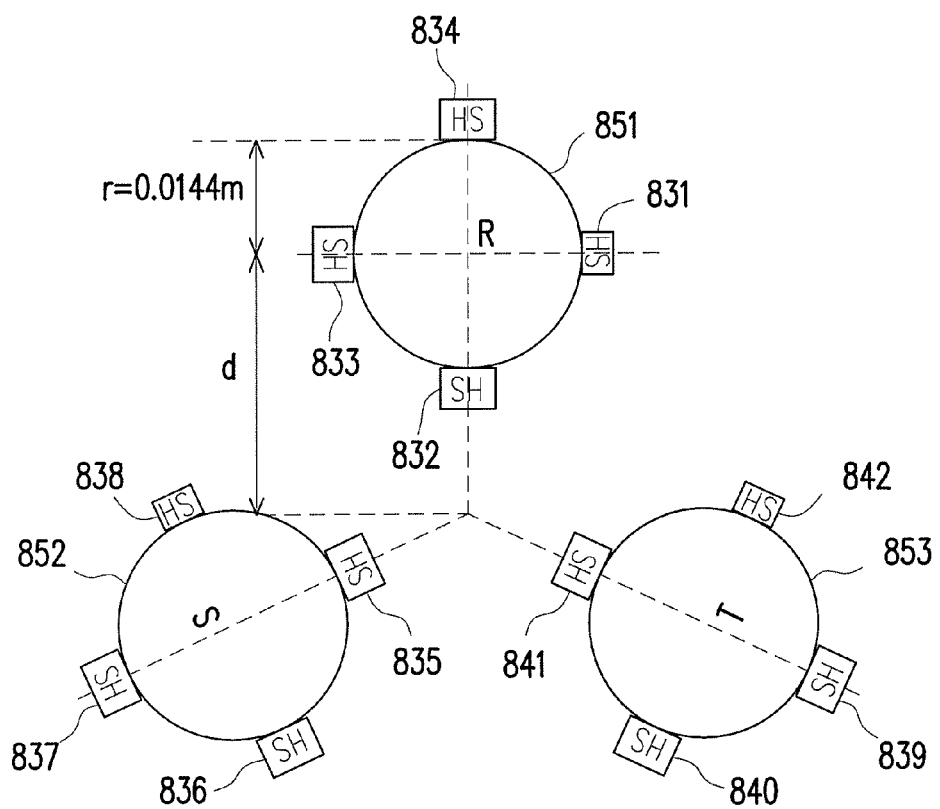
FIG. 8B is a schematic diagram showing the method and apparatus for current measurement using the Hall sensors without iron cores in the three-phase power system while the R, S and T electric conducting cables are arranged in a regular triangle.

Referring to FIGS. 8A and 8B, FIG. 8A is a schematic diagram showing the method and apparatus for current measurement using the Hall sensors without iron cores in the three—phase power system while the R, S and T electric conducting cables are arranged in parallel vertically in the same place, and FIG. 8B is a schematic diagram showing the method and apparatus for current measurement using the Hall sensors without iron cores in the three-phase power system while the R, S and T electric conducting cables are arranged in a regular triangle. In these exemplary examples, a plurality of Hall sensors 801~812, 831~842 with 90° deviation are used in the R, S and T electric conducting cables 821~823, 851~453. The R, S and T electric conducting cables 821~823 and 851~853 are electric conducting cables with radii r=0.0144 meter. In FIG. 8A, the distance between the two closest electric conducting cables is represented as d; however, in FIG. 8B, d is represented as the distance between each electric conducting cable and the center of the regular triangle.

Figure 9A:
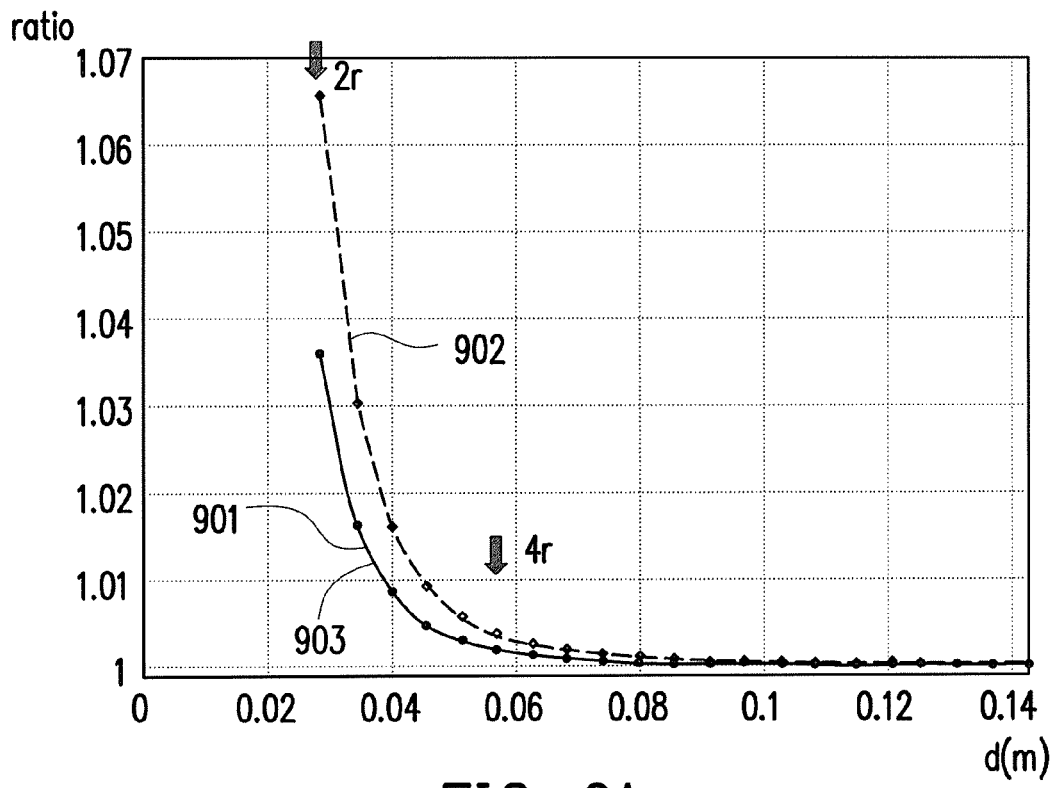
FIG. 9A is a curve diagram showing the distance versus the ratio of the estimated flowing current over the actual flowing current in the electric conducting cable of FIG. 8A.
Figure 9B:
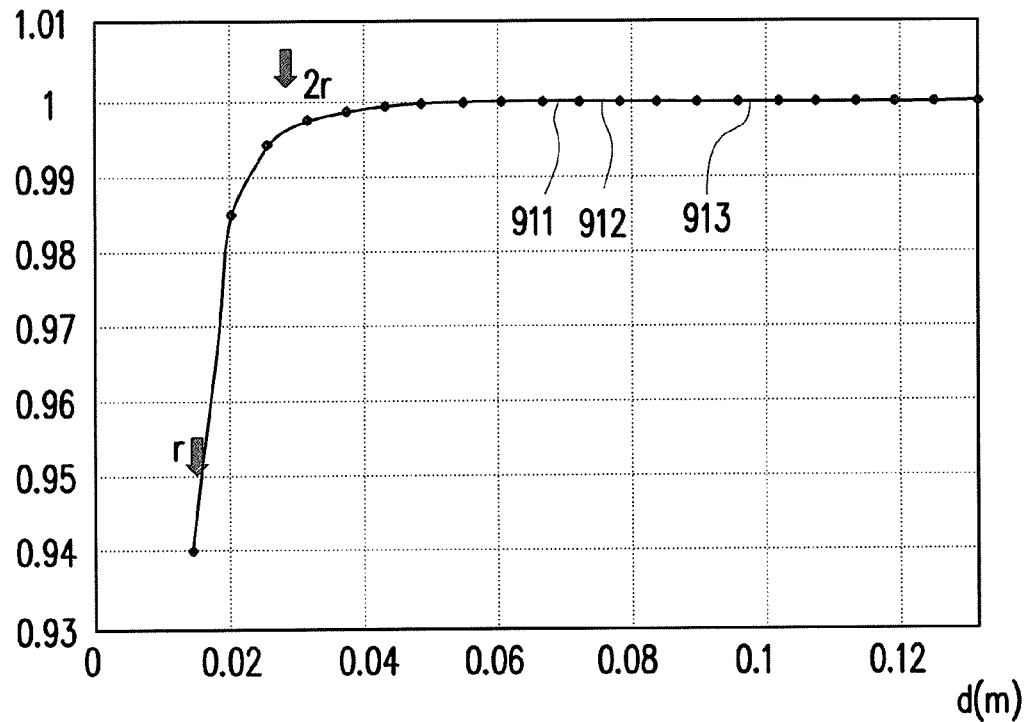
FIG. 9B is a curve diagram showing the distance versus the ratio of the estimated flowing current over the actual flowing current in the electric conducting cable of FIG. 8B.

Referring to FIGS. 9A and 9B, FIG. 9A is a curve diagram showing the distance versus the ratio of the estimated flowing current over the actual flowing current in the electric conducting cable of FIG. 8A, and FIG. 9B is a curve diagram showing the distance versus the ratio of the estimated flowing current over the actual flowing current in the electric conducting cable of FIG. 8B.

In FIG. 9A, curves 901~903 represent the ratios of the estimated flowing currents over the actual flowing currents in the R, S, T electric conducting cables 821~823 respectively. When the distance d is 2r, the maximum error rate between the estimated flowing currents and the actual flowing currents is about 6.6%. When the distance d is 4r, the maximum error rate between the estimated flowing currents and the actual flowing currents is about 0.5%.

In FIG. 9B, curves 911~913 represent the ratios of the estimated flowing currents over the actual flowing currents in the R, S, T electric conducting cables 821~823 respectively. When the distance d is r, the maximum error rate between the estimated flowing currents and the actual flowing currents is about 6.1%. When the distance d is 2r, the maximum error rate between the estimated flowing currents and the actual flowing currents is about 0.5%.

From FIGS. 9A and 9B, the method and apparatus for current measurement using the Hall sensors without iron cores in the three-phase power system can obtain a precise estimated flowing current. That is, the method and apparatus for current measurement using Hall sensors without iron cores provided by the exemplary examples of the present invention can eliminate the ambient interference and the effect caused by the measured electric conducting cable being not an infinitely long straight conductor.

Now, a fault condition of the three-phase power system is considered. When the three-phase power system has a fault, the flowing current will enter into a transient state. That is the flowing current in the electric conducting cable may have a component of direct current and the value of the flowing current is much larger than the flowing current in the static state.

Figure 10:
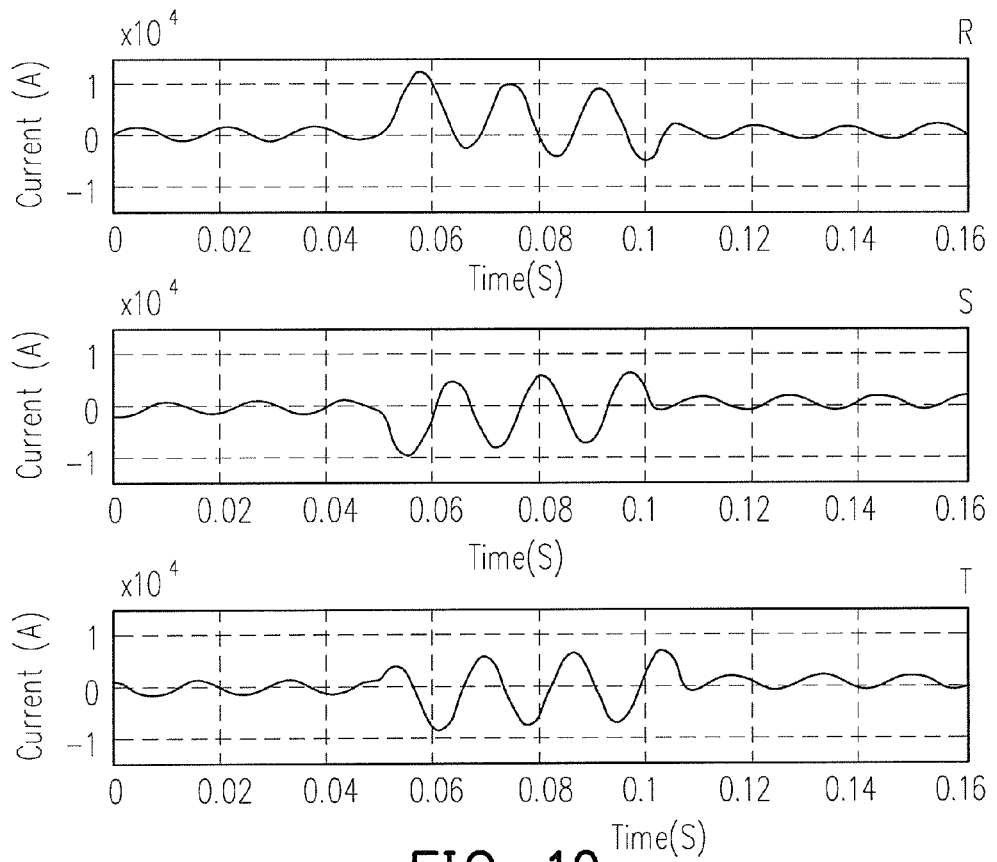
FIG. 10 is the curve diagram showing the value of the flowing currents in the R, S, and T electric conducting cables when the three-phase power system has a fault.

Referring to FIG. 10, FIG. 10 is the curve diagram showing the value of the flowing currents in the R, S, and T electric conducting cables when the three-phase power system has a fault. The fault happens at 0.05 seconds and recovers at 0.1 seconds. From FIG. 10, the flowing currents are in transient states in the interval of 0.05 to 0.1 seconds, and the flowing currents are in the static states at the other time.

Figure 11A:
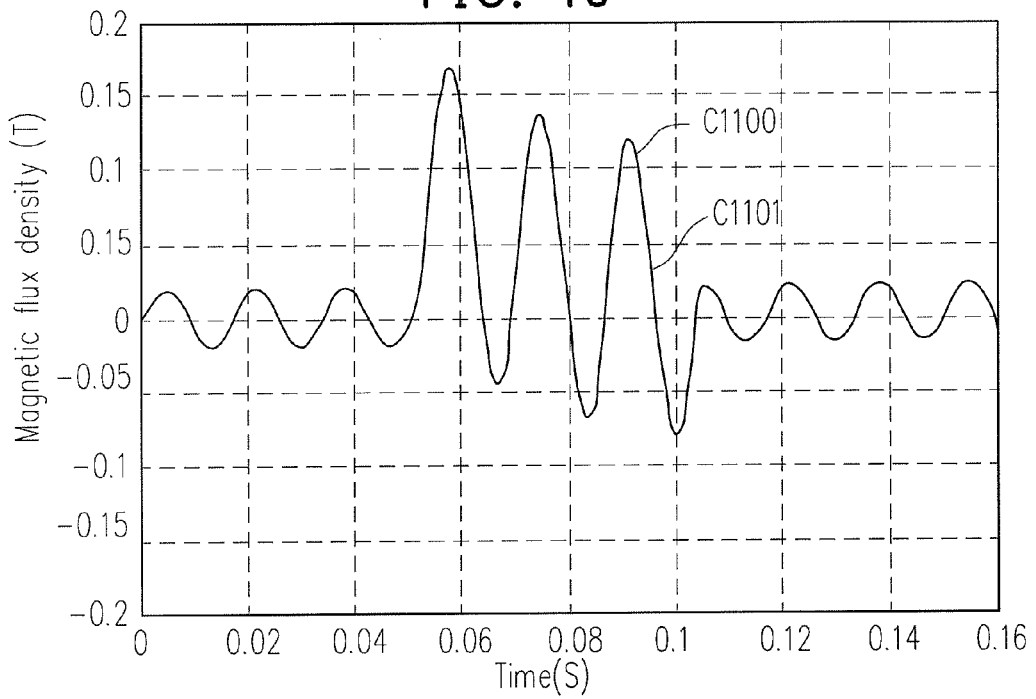
FIGS. 11A~11C are the curve diagrams showing the magnetic flux densities of the estimated flowing currents and actual flowing currents in the R, S, and T electric conducting cables respectively when the R, S, and T electric conducting cables are arranged as in FIG. 8A with distance d=4r.
Figure 11B:
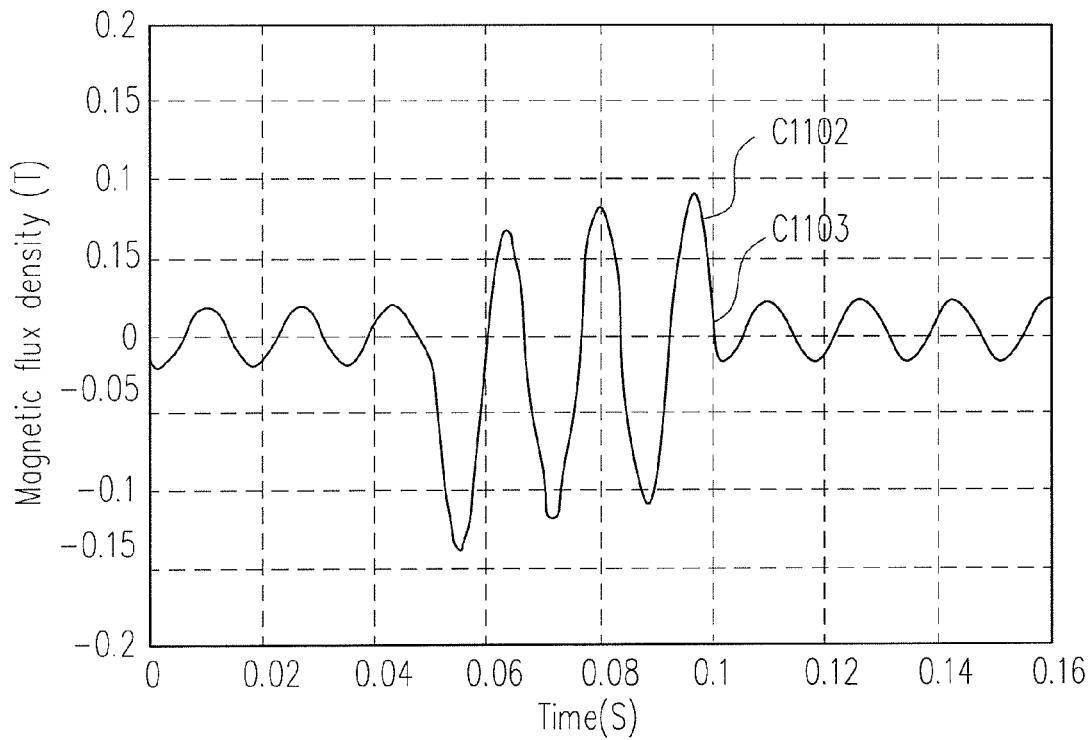
Figure 11C:
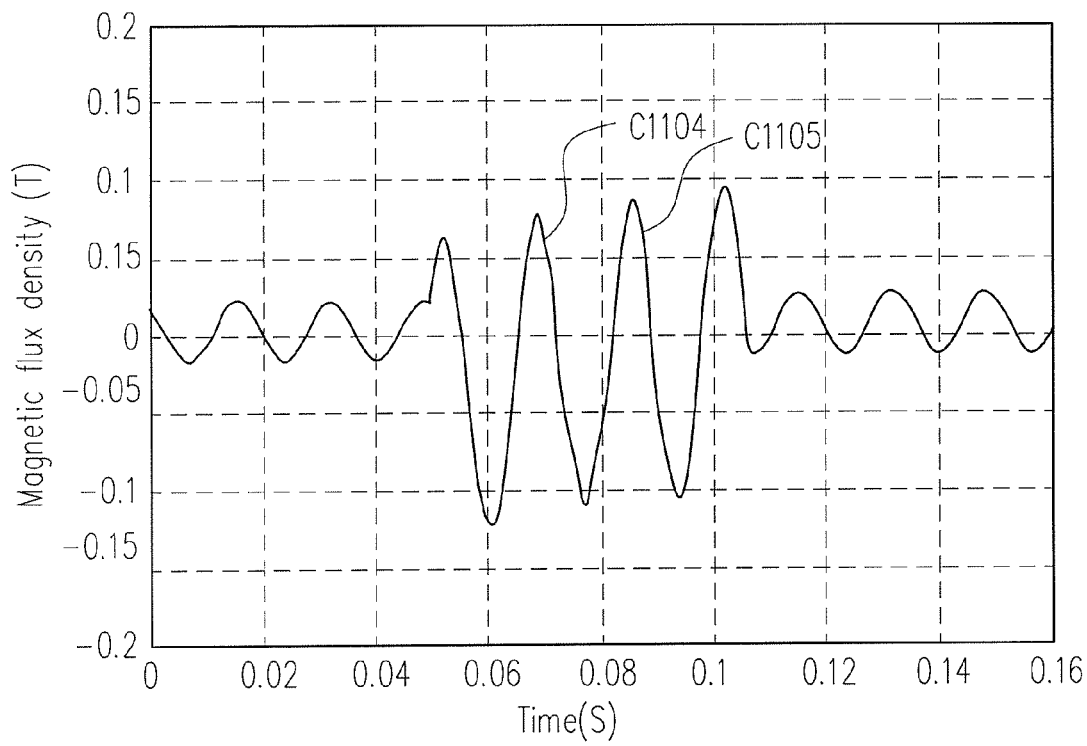

Please see FIGS. 11A~11C, FIGS. 11A~11C are the curve diagrams showing the magnetic flux densities of the estimated flowing currents and actual flowing currents in the R, S, and T electric conducting cables respectively when the R, S, and T electric conducting cables are arranged same as FIG. 8A with distance d=4r. The curves of the magnetic flux densities of the estimated flowing currents and actual flowing currents in the R electric conducting cable of FIG. 11A are represented as curves C1100 and C1101. The two curves C1100 and C1101 approach each other. The curves of the magnetic flux densities of the estimated flowing currents and actual flowing currents in the S electric conducting cable of FIG. 11B are represented as curves C1102 and C1103. The two curves C1102 and C1103 approach each other. The curves of the magnetic flux densities of the estimated flowing currents and actual flowing currents in the T electric conducting cable of FIG. 11C are represented as curves C1104 and C1105. The two curves C1104 and C1105 approach each other.

Figure 12A:
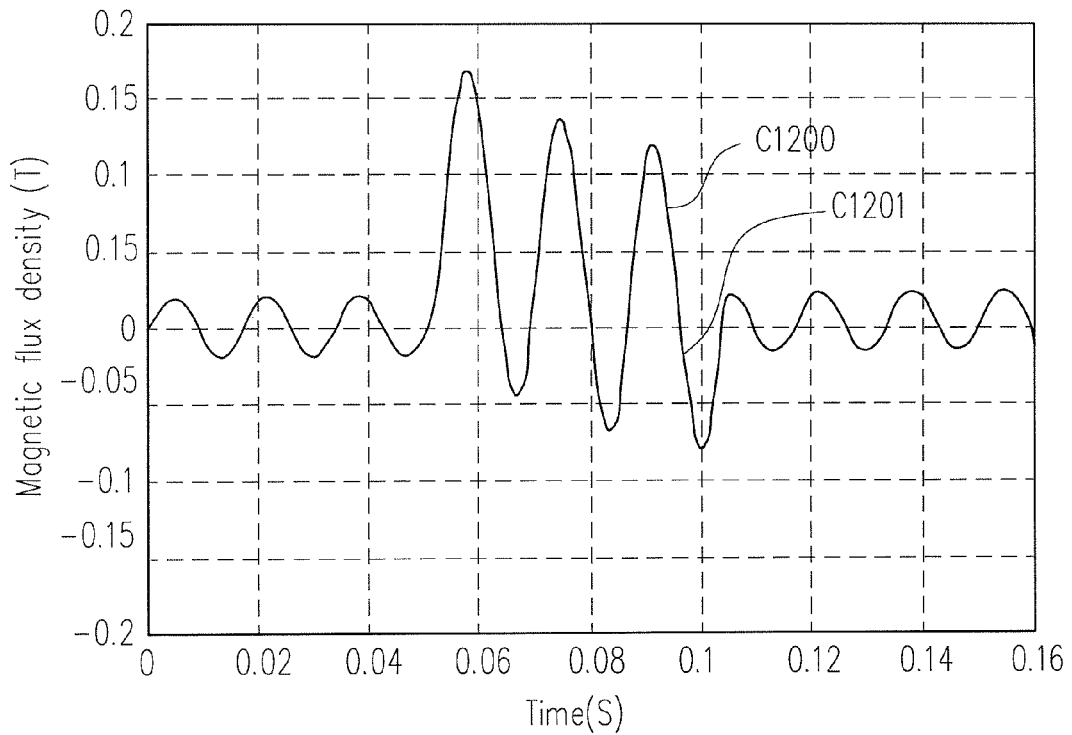
FIGS. 12A~12C are the curve diagrams showing the magnetic flux densities of the estimated flowing currents and actual flowing currents in the R, S, and T electric conducting cables respectively when the R, S, and T electric conducting cables are arranged as in FIG. 8B with distance d=2r.
Figure 12B:
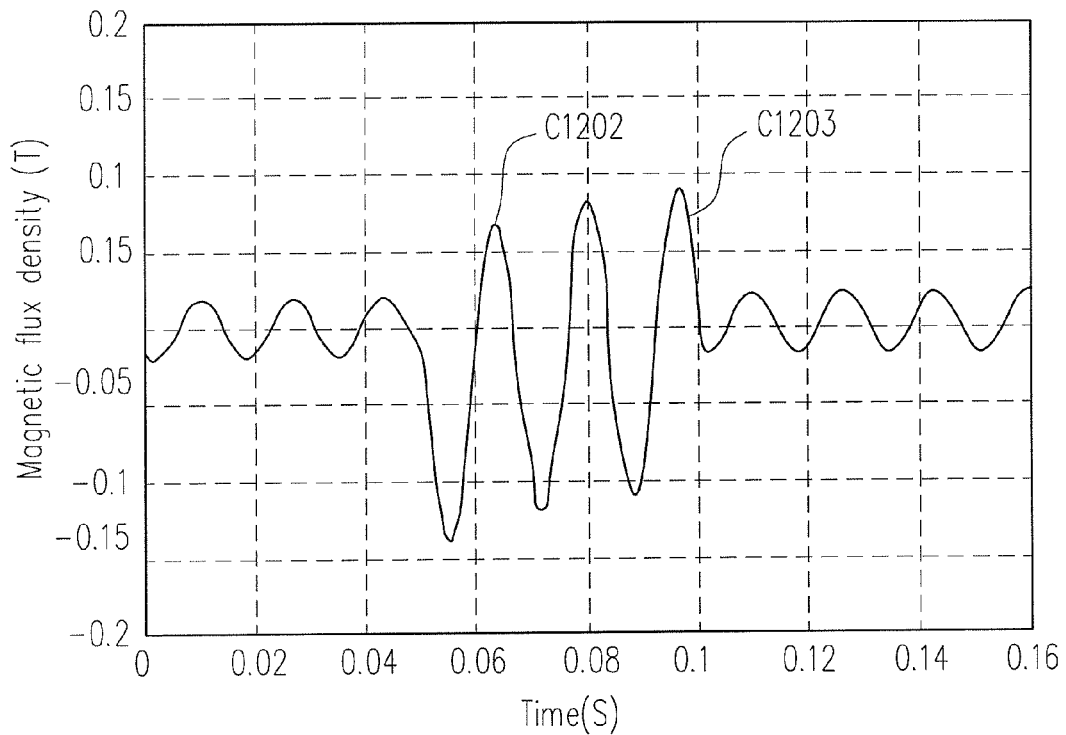

Please see FIGS. 12A~11C, FIGS. 12A~12C are the curve diagrams showing the magnetic flux densities of the estimated flowing currents and actual flowing currents in the R, S, and T electric conducting cables respectively when the R, S, and T electric conducting cables are arranged same as FIG. 8B with distance d=2r. The curves of the magnetic flux densities of the estimated flowing currents and actual flowing currents in the R electric conducting cable of FIG. 12A are represented as curves C1200 and C1201. The two curves C1200 and C1201 approach each other. The curves of the magnetic flux densities of the estimated flowing currents and actual flowing currents in the S electric conducting cable of FIG. 12B are represented as curves C1202 and C1203.

Figure 12C:
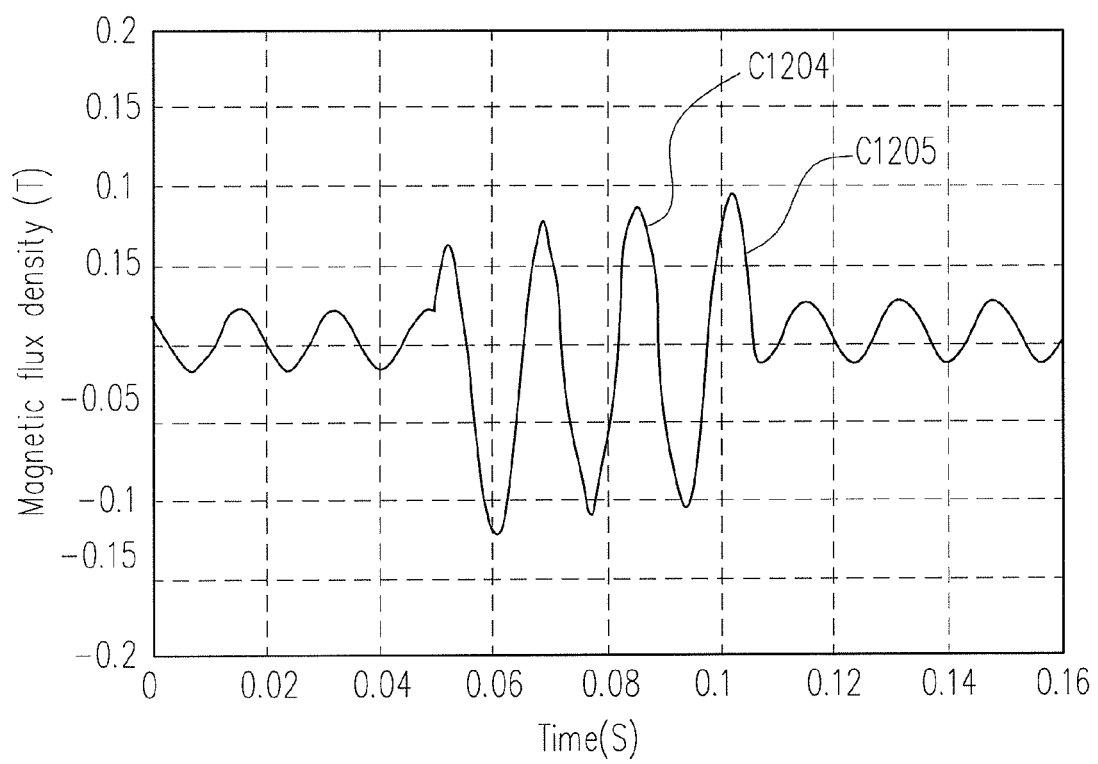

The two curves C1202 and C1203 approach each other. The curves of the magnetic flux densities of the estimated flowing currents and actual flowing currents in the T electric conducting cable of FIG. 12C are represented as curves C1204 and C1205. The two curves C1204 and C1205 approach each other.

From FIGS. 11A~12C, whether the actual flowing currents in the static or transient states, the method and apparatus for current measurement using Hall sensors without irons provided by the exemplary example of the present invention can obtain the precise estimated flowing currents which approximately reflect the real waveforms of the actual flowing currents. That is, the method and apparatus for current measurement using Hall sensors without irons provided by the exemplary example of the present invention do not have the problem of direct current saturation.

Figure 13A:
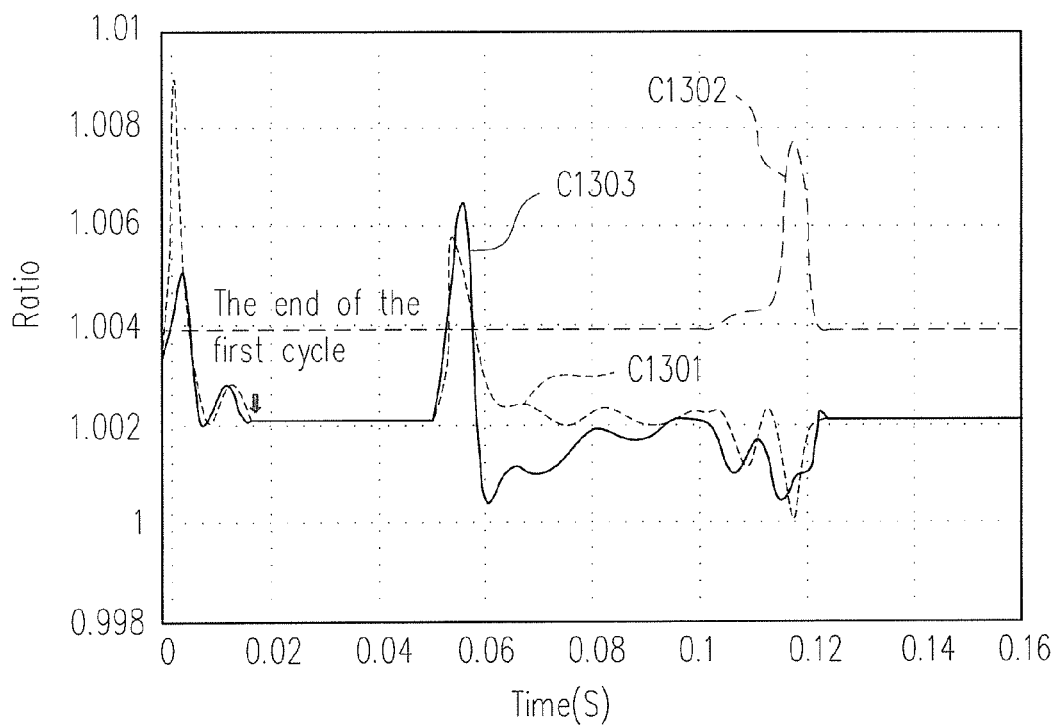
FIG. 13A is a curve diagram showing the ratios of the estimated flowing currents over the actual flowing currents in the electric conducting cables of FIG. 8A with d=4r when the three-phase power system supplies the actual flowing currents as FIG. 10.
Figure 13B:
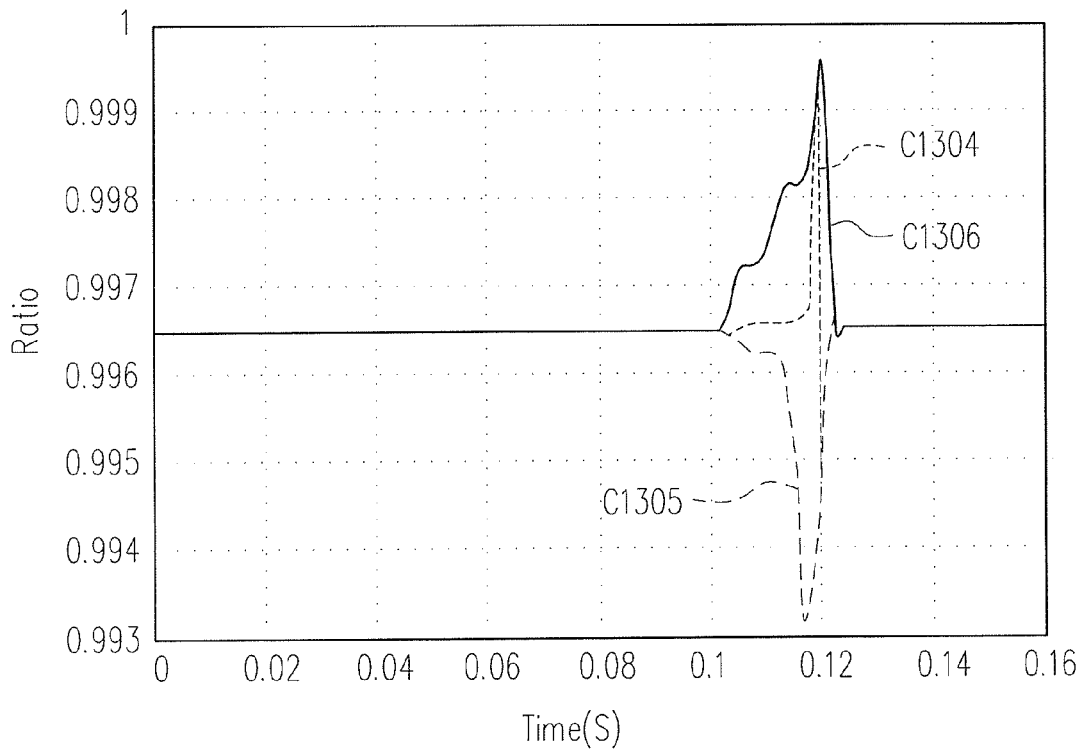
FIG. 13B is a curve diagram showing the ratios of the estimated flowing currents over the actual flowing currents in the electric conducting cables of FIG. 8B with d=2r when the three-phase power system supplies the actual flowing currents as FIG. 10.

Referring to FIGS. 13A and 13B, FIG. 13A is a curve diagram showing the ratios of the estimated flowing currents over the actual flowing currents in the electric conducting cable of FIG. 8A with d=4r when the three-phase power system supplies the actual flowing currents as FIG. 10, and FIG. 13B is a curve diagram showing the ratios of the estimated flowing currents over the actual flowing currents in the electric conducting cable of FIG. 8B with d=2r when the three-phase power system supplies the actual flowing currents as FIG. 10.

In FIGS. 13A and 13B, the ratios based on RMS values of all currents. Therefore, before the first period (i.e. before 0.0167 seconds), the calculation for RMS values of all currents are not completed yet, and the ratios cannot be put into comparison. However, after the first cycle, whether the R, S and T electric conducting cables are arranged in parallel vertically in the same place or in a regular triangle, the maximum error rate of the estimated and actual flowing currents in the static states is below 0.5%, and the maximum error rate of the estimated and actual flowing currents in the transient states is increased but still below 0.8%.

Now, the angle of the arrangement of the Hall sensors on the electric conducting cable is considered. In the practical use, the angle of the arrangement of the Hall sensors may be not same as the angles of the arrangement of the Hall sensors in FIGS. 8A and 8B.

Figure 14:
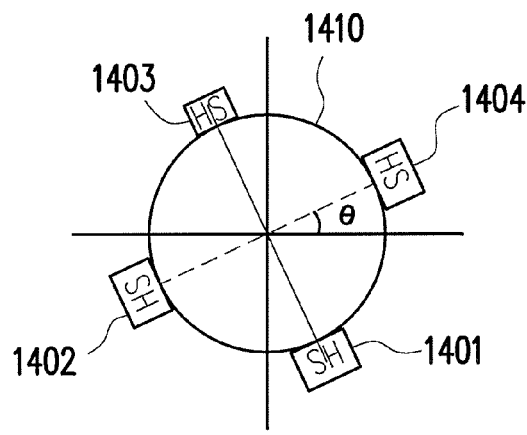
FIG. 14 is a schematic diagram showing the angle θ of the arrangement of the Hall sensors on the electric conducting cable.
Figure 15A:
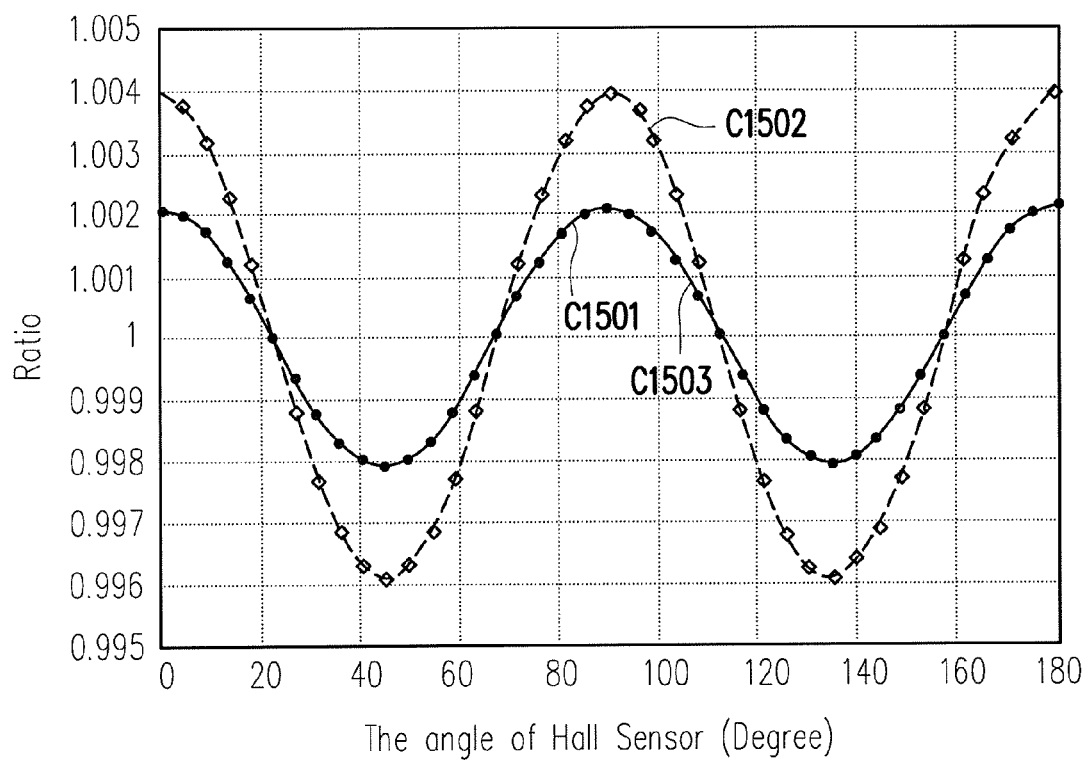
FIG. 15A is a curve diagram showing the ratios of the estimated flowing currents over the actual flowing currents in the electric conducting cables of FIG. 8A with d=4r when the angles θ of the arrangements of the Hall sensors on the R, S, and T electric conducting cables are the same as FIG. 14.
Figure 15B:
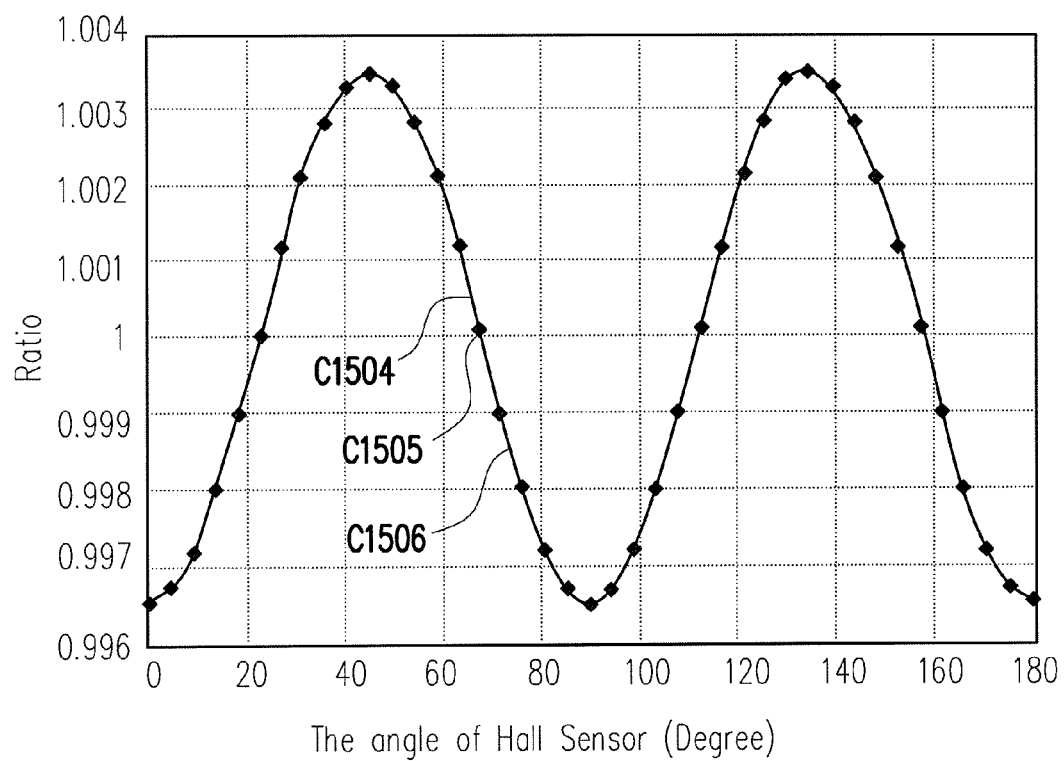
FIG. 15B is a curve diagram showing the ratios of the estimated flowing currents over the actual flowing currents in the electric conducting cables of FIG. 8B with d=2r when the angles θ of the arrangements of the Hall sensors on the R, S, and T electric conducting cables are the same as FIG. 14.

Referring to FIG. 14, FIG. 14 is a schematic diagram showing the angle θ of the arrangement of the Hall sensors on the electric conducting cable. The Hall sensors 1401~4404 are attached to or located near the electric conducting cable 1410. Referring to FIGS. 15A~15B FIG. 15A is a curve diagram showing the ratios of the estimated flowing currents over the actual flowing currents in the electric conducting cables of FIG. 8A with d=4r when the angles θ of the arrangements of the Hall sensors on the R, S, and T electric conducting cables are same as FIG. 14, and FIG. 15B is a curve diagram showing the ratios of the estimated flowing currents over the actual flowing currents in the electric conducting cable of FIG. 8B with d=2r when the angles θ of the arrangements of the Hall sensors on the R, S, and T electric conducting cables are same as FIG. 14.

In FIG. 15A, the curves C1501~C1503 represent the ratios of the estimated flowing currents over the actual flowing currents in the R, S, and T electric conducting cables. In FIG. 15B, the curves C1504~C1506 represent the ratios of the estimated flowing currents over the actual flowing currents in the R, S, and T electric conducting cables. From FIGS. 15A-15B, the maximum rate of the estimated and actual flowing currents is below 0.5%. It is noted that the angle θ of the arrangement of the Hall sensors on the electric conducting cable in the method and apparatus for current measurement using the Hall sensors without iron cores is not used to limit the scope of the present invention, and the angle θ of the arrangement of the Hall sensors can be arbitrary.

Figure 16:
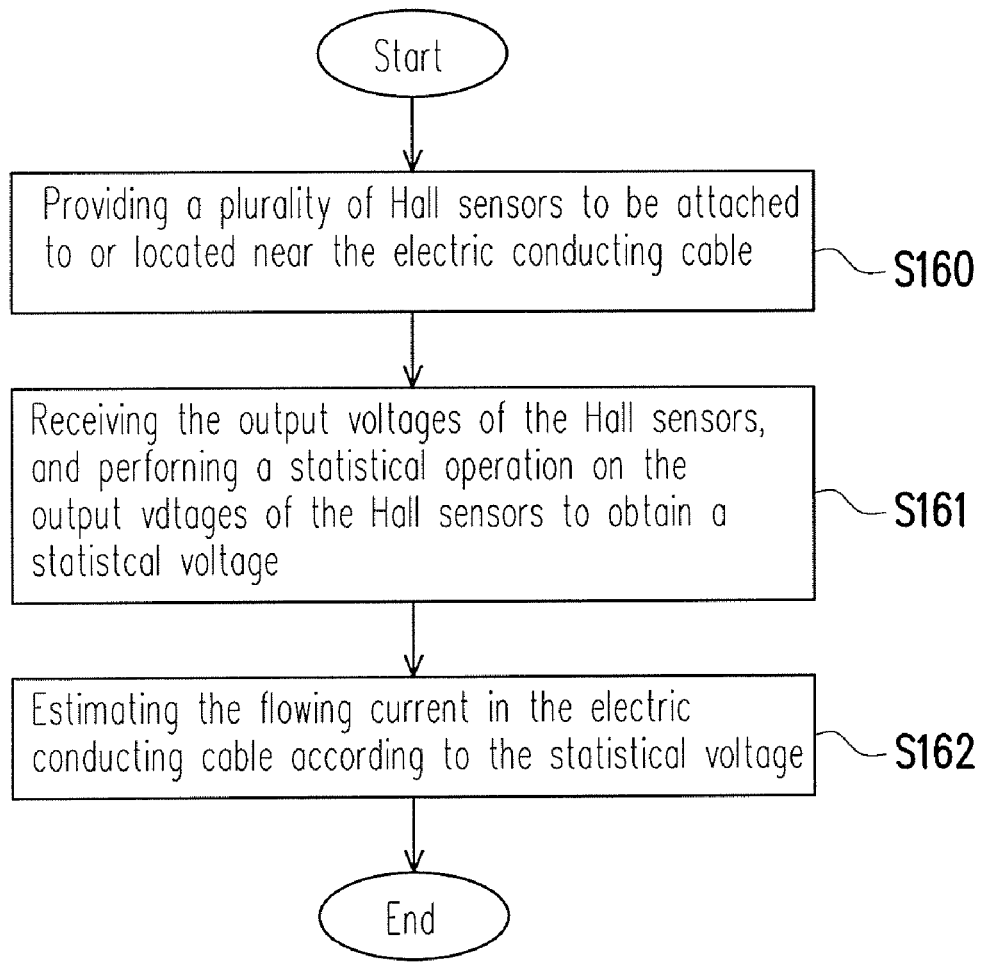
FIG. 16 is a flow chart showing the method for current measurement using the Hall sensors without iron cores according to one of the exemplary examples of the present invention.

Referring to FIG. 16, FIG. 16 is a flow chart showing the method for current measurement using the Hall sensors without iron cores according the one of the exemplary examples of the present invention. In step S160, a plurality of Hall sensors is provided to be attached to or located near the electric conducting cables. It is noted that the arrangement of the Hall sensors may be symmetric or asymmetric, and the number of the Hall sensors is larger than 1.

Then, in step S161, the Hall sensors output the output voltages according to their measured flux densities of the magnetic field, and a statistical operation circuit performs a statistical operation on the output voltages of the Hall sensors to obtain a statistical voltage. The statistical operation may be an average calculation, and the statistical voltage may be the average voltage of the output voltages of the Hall sensors. Finally, in step S162, the rear circuit of the apparatus for current measurement using the Hall sensors without iron cores estimates the flowing current in the electric conducting cable according to the statistical voltage.

Accordingly, the exemplary examples of the present invention provide method and apparatus for current measurement using Hall sensors without iron cores. The method and apparatus for current measurement using Hall sensors without iron cores can be used to measure the current of the electric conducting cable whether the power system has one electric conducting cable or a plurality of electric conducting cables to supply the power. The method and apparatus for current measurement using Hall sensors without iron cores provided by the exemplary examples of the present invention can eliminate the ambient interference and the effect caused by the measured electric conducting cable being not an infinitely long straight conductor.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. An apparatus for current measurement using Hall sensors without iron cores, used to estimate a flowing current in an electric conducting cable, comprising:

the Hall sensors, each of the Hall sensors is used for attaching to or locating near the electric conducting cable and to measure the flux density of the magnetic field directly generated by the flowing current, so as to generate an output voltage according to the flux density of the magnetic field; and a statistical operation circuit, coupled to the Hall sensors, to receive the output voltages of the Hall sensors, and to perform a statistical operation on the output voltages of the Hall sensors, so as to obtain a statistical voltage, the statistical operation circuit comprising:

an operation amplifier, having first and second input ends and an output end, the second input end is coupled to ground;

a plurality of first resistors, each of the first resistors is coupled between the first input end and the Hall sensors; and a second resistor, coupled between the first input end and the output end, wherein the apparatus for current measurement using Hall sensors without iron cores estimates the flowing current according to the statistical voltage.

2. The apparatus for current measurement using Hall sensors without iron cores of claim 1, wherein the number of the Hall sensors is two, and the two Hall sensors attached to or located near the electric conducting cable are deviated with 180°.

3. The apparatus for current measurement using Hall sensors without iron cores of claim 1, wherein the number of the Hall sensors is four, and the four Hall sensors attached to or located near the electric conducting cable are deviated with 90°.

4. The apparatus for current measurement using Hall sensors without iron cores of claim 1, wherein the statistical operation is an average calculation.

5. The apparatus for current measurement using Hall sensors without iron cores of claim 1, wherein the electric conducting cable is a Wire Gauge (AWG) cable, a Cross-Linked Polyethylene (XLPE) cable, a Polyethylene (PE) cable, a Polyvinyl (PVC) cable, a Polyether Sulfone (PES) calbe, or a Polyetheretherketone (PEEK) cable.

6. The apparatus for current measurement using Hall sensors without iron cores of claim 1, wherein an arrangement of the Hall sensors attached on or located near the electric conducting cable is a symmetrical arrangement.

7. An apparatus for current measurement using Hall sensors without iron cores, used to estimate a flowing current in an electric conducting cable of a three-phase power system, comprising:

the Hall sensors, each of the Hall sensors is used for attaching to or locating near the electric conducting cable and to measure the flux density of the magnetic field directly generated by the flowing current, so as to generate an output voltage according to the flux density of the magnetic field; and a statistical operation circuit, coupled to the Hall sensors, to receive the output voltages of the Hall sensors, and to perform a statistical operation on the output voltages of the Hall sensors, so as to obtain a statistical voltage, the statistical operation circuit comprising:

an operation amplifier, having first and second input ends and an output end, the second input end is coupled to ground;

a plurality of first resistors, each of the first resistors is coupled between the first input end and the Hall sensors; and a second resistor, coupled between the first input end and the output end, wherein the apparatus for current measurement using Hall sensors without iron cores estimates the flowing current according to the statistical voltage.

8. The apparatus for current measurement using Hall sensors without iron cores of claim 7, wherein the number of the Hall sensors is four, and the four Hall sensors attached to or located near the electric conducting cable are deviated with 90°.

9. The apparatus for current measurement using Hall sensors without iron cores of claim 7, wherein the statistical operation is an average calculation.

10. The apparatus for current measurement using Hall sensors without iron cores of claim 7, wherein an arrangement of the Hall sensors attached to or located near the electric conducting cable is a symmetrical arrangement.

11. The apparatus for current measurement using Hall sensors without iron cores of claim 7, wherein the electric conducting cable is a Wire Gauge (AWG) cable, a Cross-Linked Polyethylene (XLPE) cable, a Polyethylene (PE) cable, a Polyvinyl (PVC) cable, a Polyether Sulfone (PES) calbe, or a Polyetheretherketone (PEEK) cable.

* * * * *